United States Patent
Ito et al.

(10) Patent No.: US 8,199,443 B2
(45) Date of Patent: Jun. 12, 2012

(54) MAGNETO-RESISTANCE EFFECT ELEMENT, MAGNETIC HEAD, MAGNETIC RECORDING DEVICE AND MAGNETIC MEMORY

(75) Inventors: Junichi Ito, Yokohama (JP); Hideaki Fukuzawa, Kawasaki (JP); Hiromi Yuasa, Kawasaki (JP); Yoshihiro Fuji, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 968 days.

(21) Appl. No.: 12/073,491

(22) Filed: Mar. 6, 2008

(65) Prior Publication Data
US 2008/0239587 A1 Oct. 2, 2008

(30) Foreign Application Priority Data
Mar. 27, 2007 (JP) ................ P2007-082013

(51) Int. Cl.
*G11B 5/39* (2006.01)
(52) U.S. Cl. .................................. 360/313
(58) Field of Classification Search ............. None
See application file for complete search history.

(56) References Cited

U.S. PATENT DOCUMENTS

| | | | | |
|---|---|---|---|---|
| 5,181,149 A * | 1/1993 | Katsumata et al. | ...... | 360/119.07 |
| 6,114,056 A | 9/2000 | Inomata et al. | | |
| 6,219,275 B1 | 4/2001 | Nishimura | | |
| 6,929,957 B2 | 8/2005 | Min et al. | | |
| 6,937,446 B2 | 8/2005 | Kamiguchi et al. | | |
| 7,046,489 B2 | 5/2006 | Kamiguchi et al. | | |
| 7,173,793 B2 * | 2/2007 | Ishiwata et al. | .......... | 360/125.07 |
| 2002/0159201 A1 | 10/2002 | Li et al. | | |
| 2003/0133234 A1 * | 7/2003 | Furukawa et al. | ........ | 360/324.12 |
| 2005/0276998 A1 | 12/2005 | Sato | | |
| 2006/0119982 A1 * | 6/2006 | Honjo et al. | ................... | 360/126 |
| 2006/0132990 A1 * | 6/2006 | Morise et al. | ............ | 360/324.12 |
| 2006/0164764 A1 | 7/2006 | Kamiguchi et al. | | |
| 2007/0253122 A1 | 11/2007 | Fukuzawa et al. | | |

FOREIGN PATENT DOCUMENTS

| | | |
|---|---|---|
| EP | 0 687 917 | 12/1995 |
| EP | 0 877 398 | 5/1998 |
| EP | 1 607 941 | 12/2005 |
| JP | 09-306733 | 11/1997 |
| JP | 10-173252 | 6/1998 |
| JP | 11-238923 | 8/1999 |
| JP | 2000-188435 | 4/2000 |

(Continued)

OTHER PUBLICATIONS

Yonsei University Master Thesis, "Voltage Difference Amplification Circuit for Improving the Sensing Characteristics of MRAM", Dec. 2005 and brief English-language translation thereof.
Ceramist vol. 4 No. 5, Special Edition, "Magnetic Sensor Technologies and Applications Using Giant Magentoresistance Effect", Oct. 2001.

(Continued)

*Primary Examiner* — Mark Blouin
(74) *Attorney, Agent, or Firm* — Nixon & Vanderhye, P.C.

(57) ABSTRACT

A magneto-resistance effect element includes: a first magnetic layer of which a first magnetization is fixed in one direction; a second magnetic layer of which a second magnetization is fixed in one direction; a spacer layer located between the first magnetic layer and the second magnetic layer and made of at least one selected from the group consisting of an oxide, a nitride, an oxynitride and a metal; and a current bias generating portion, which is located adjacent to the spacer layer, for applying a bias magnetic field to the spacer layer.

20 Claims, 10 Drawing Sheets

FOREIGN PATENT DOCUMENTS

| | | |
|---|---|---|
| JP | 2002-208744 | 7/2002 |
| JP | 2003-006821 | 1/2003 |
| JP | 2005-353236 | 12/2005 |
| JP | 2006-303097 | 11/2006 |
| KR | 10-2005-0027159 | 3/2005 |
| KR | 10-2005-0118649 | 12/2005 |

OTHER PUBLICATIONS

Seoul University Doctoral Thesis, A Study on the Development of New Spin Wave Structures for Magnetoresistive RAM based on Giant Magentoresistance and Tunneling, Aug. 2001 and brief English-language translation thereof.

* cited by examiner

MAGNETO-RESISTANCE EFFECT ELEMENT, MAGNETIC HEAD, MAGNETIC RECORDING DEVICE AND MAGNETIC MEMORY

CROSS-REFERENCE TO RELATED APPLICATIONS

This application is based upon and claims the benefit of priority from the prior Japanese Patent Application No. 2007-082013, filed on Mar. 27, 2007; the entire contents of which are incorporated herein by reference.

BACKGROUND OF THE INVENTION

1. Field of the Invention

The present invention relates to a magneto-resistance effect element which is configured such that a sense current is flowed in the direction perpendicular to the film surface thereof. The present invention also relates to a magnetic head, a magnetic recording device and a magnetic memory which utilize the magneto-resistance effect element according to the present invention.

2. Description of the Related Art

Recently, the performance of a magnetic device, particularly such as a magnetic head is enhanced by means of Giant Magneto-Resistance Effect (GMR) made of a multilayered magnetic structure. Particularly, since a spin valve film (SV film) can exhibit a larger GMR effect, the SV film has developed the magnetic device such as a magnetic head and MRAM (Magnetic Random Access Memory).

The "spin valve" film has such a structure as sandwiching a non-magnetic spacer layer between two ferromagnetic layers and is configured such that the magnetization of one ferromagnetic layer (often called as a "pinning layer" or "fixed magnetization layer) is fixed by the magnetization of an anti-ferromagnetic layer and the magnetization of the other ferromagnetic layer (often called as a "free layer" or "free magnetization layer") is rotated in accordance with an external magnetic field. With the spin valve film, the large MR effect can be obtained by the variation of the relative angle in magnetization between the pinned layer and the free layer.

The spacer layer magnetically divides the pinned layer and the free layer so that the magnetization of the free layer can be rotated independently from the magnetization of the pinned layer.

A conventional spin valve film is employed for a CIP (Current In plane)-GMR element, a CPP (Current Perpendicular to Plane)-GMR element and a TMR (Tunneling Magneto Resistance) element. In the CIP-GMR element, a sense current is flowed to the SV film in the direction parallel to the film surface thereof. In the CPP-GMR element and the TMR element, a sense current is flowed to the SV film in the direction almost perpendicular to the film surface thereof.

In such a magneto-resistance effect element as using the SV film to which the sense current is flowed in the direction perpendicular to the film surface, the TMR element uses an insulating layer as the spacer layer and the CPP-GMR element uses a metallic layer as the spacer layer. As the evolution type of the CPP-GMR element, such a magneto-resistance effect element as using a spacer layer with a nano-oxide layer (NOL) containing nano-sized metallic current paths throughout the NOL along the thickness direction thereof is proposed. In this case, a current-confined path (CCP) to exhibit metallic conduction is formed partially in the NOL (Reference 1).

Reference 1 JP-A 2002-208744 (KOKAI)

In any type of conventional magneto-resistance effect element, the pinned layer, the spacer layer and the free layer are fundamentally contained such that an external magnetic field is detected on the relative angle in magnetization between the pinned layer and the free layer.

BRIEF SUMMARY OF THE INVENTION

An aspect of the present invention relates to a magneto-resistance effect element, including: a first magnetic layer of which a first magnetization is fixed in one direction; a second magnetic layer of which a second magnetization is fixed in one direction; a spacer layer which is located between the first magnetic layer and the second magnetic layer and which is made of at least one selected from the group consisting of an oxide, a nitride, an oxynitride and a metal; and a current bias generating portion, which is located adjacent to the spacer layer, for applying a bias magnetic field to the spacer layer.

Another aspect of the present invention relates to a magneto-resistance effect element, including: a first magnetic layer of which a first magnetization is fixed in one direction; a spacer layer which is located on the first magnetic layer and which is made of at least one selected from the group consisting of an oxide, a nitride, an oxynitride and a metal; a magnetic sensitive reproducing portion (second magnetic layer) which is located on the spacer layer and of which a second magnetization is fixed in one direction; and an exchange coupling layer which is located on the spacer layer so as to be contacted with both ends of the spacer layer except the magnetic sensitive reproducing portion and which conducts an exchange coupling for the spacer layer.

In a conventional GMR element such as a SV film, a pinned layer and a free layer are formed so as to sandwich a non-magnetic spacer layer, thereby constituting a spin dependent scattering unit. In this case, the intended MR effect is generated through the change in resistance of the element by the rotation of the magnetization of the free layer. However, since the magnetization of the free layer is larger, a larger bias magnetic field is required in order to render the magnetic domain of the free layer a single magnetic domain. In this point of view, it is difficult to render the magnetic domain of the spacer layer the single magnetic domain so that some magnetic noise such as Barkhausen noise maybe caused.

In the aspects of the present invention, in contrast, the spacer layer, which is configured such that the magnetization is rotated in response to an external magnetic field, is formed between the first magnetic layer and the second magnetic layer which function as respective pinned layers, thereby constituting a spin dependent scattering unit, so that the intended MR effect is generated through the change in resistance of the element by the rotation of the magnetization of the spacer layer.

Since the spacer layer is made of the oxide, nitride and the like as described above, the magnetization of the spacer layer is relatively small. Therefore, the magnetic control of the spacer can be carried out by a relatively small external magnetic field, different from the free layer of the conventional SV film and the like. In this case, the magnetic domain of the spacer layer can be rendered a single magnetic domain. As a result, some magnetic noise such as Barkhausen noise can be effectively prevented.

In the aspects of the present inventions, the MR effect is generated by the change in resistance caused by the rotation of the magnetization of the spacer layer on the following reason: Namely, in the conventional SV film, the non-magnetic spacer layer is sandwiched between the pinned layer and the free layer so as to constitute the spin dependent scattering unit. Therefore, the spin information contained in the conduction electrons flowed from the pinned layer or the free layer may be diminished in the spacer layer due to the spin inversion.

On the other hand, in the magneto-resistance effect element according to the aspects as described above, since the spin information contained in the conduction electrons flowed from the pinned layer is introduced in the magnetic spacer layer (external magnetization sensitive layer), no spin inversion occurs. As a result, the spin information contained in the conduction electrons flowed from the pinned layer or the free layer can not be diminished in the spacer layer.

Generally, in order to enhance the change in resistance of a magneto-resistance effect element, that is, the MR effect thereof, it is required to maintain the spin information from the magnetic layer (pinned layer). In the magneto-resistance effect element according to the aspects of the present invention, therefore, since the spin information can be maintained in the spacer layer, the magneto-resistance effect element can exhibit a larger MR effect even though the spacer layer has a magnetization as large as the free layer of the conventional SV film.

In the first magneto-resistance effect element, the current bias generating portion conducts the magnetic domain control of the spacer layer by the bias magnetic field, and preferably renders the magnetic domain of the spacer layer a singe magnetic domain. As a result, some magnetic noise such as Barkhausen noise can be effectively prevented.

In the second magneto-resistance effect element, the exchange coupling layer conducts the magnetic domain control of the spacer layer by the exchange coupling, and preferably renders the magnetic domain of the spacer layer a singe magnetic domain.

In other aspects, a magnetic head and a magnetic memory are characterized by including the above-mentioned magneto-resistance effect element.

According to the aspects of the present invention can be provided a new magneto-resistance effect element not containing a laminated body of a pinned layer, a spacer layer and a free layer which is different from a conventional magneto-resistance effect element. Then, according to the aspects of the present invention can be provided a magnetic head, a magnetic recording device and a magnetic memory which utilize the new magneto-resistance effect element.

DETAILED DESCRIPTION OF THE INVENTION

Hereinafter, the present invention will be described in detail with reference to the drawings. In the embodiments, if not clearly designated, the alloy composition will be defined by atomic %. For clarifying the distinctive feature of each embodiment, the size and shape of each component may be different from the real ones.

(Fundamental Structure of Magneto-Resistance Effect Element)

Figure 1:
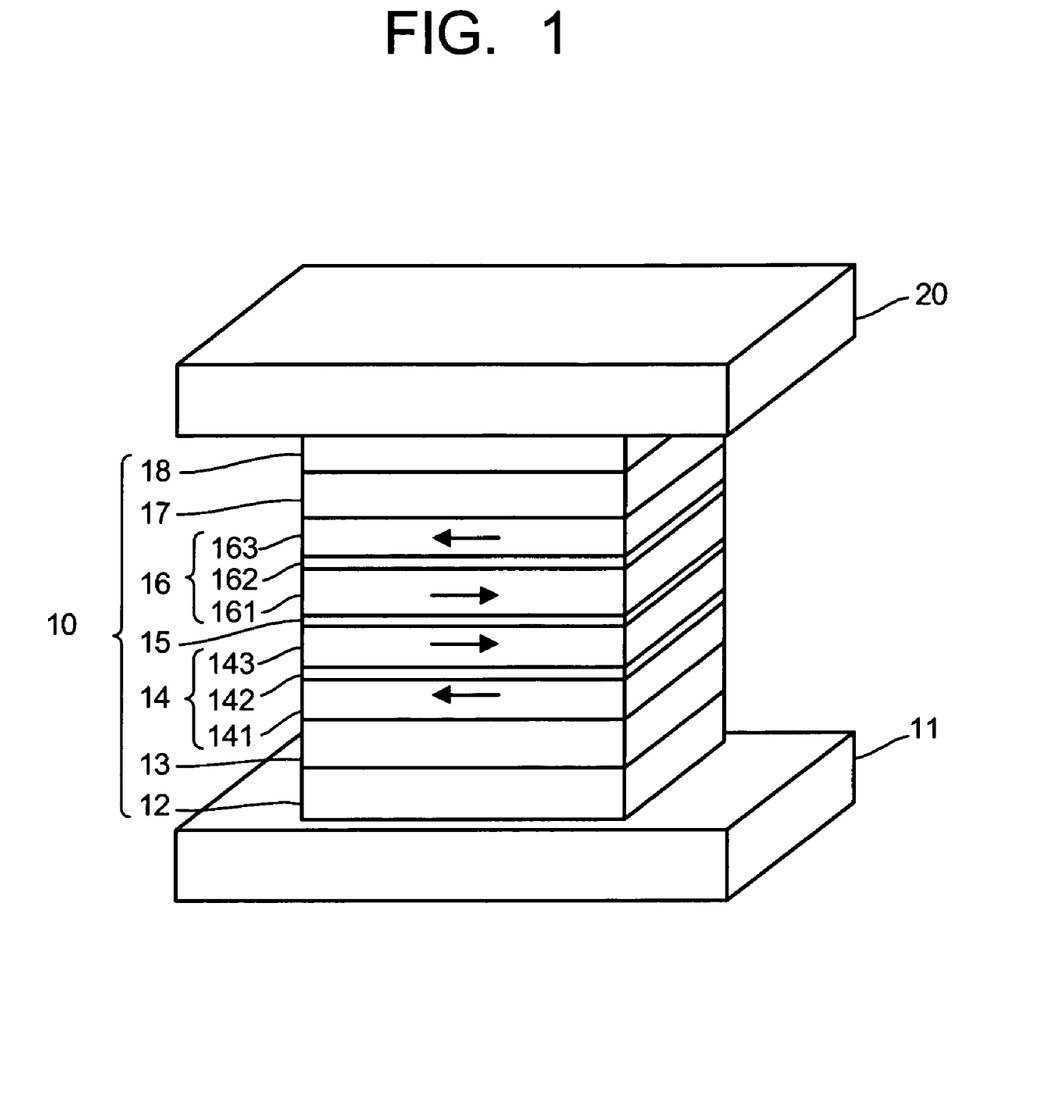
FIG. 1 is a fundamental structural view illustrating a magneto-resistance effect element according to an embodiment.
Figure 2:
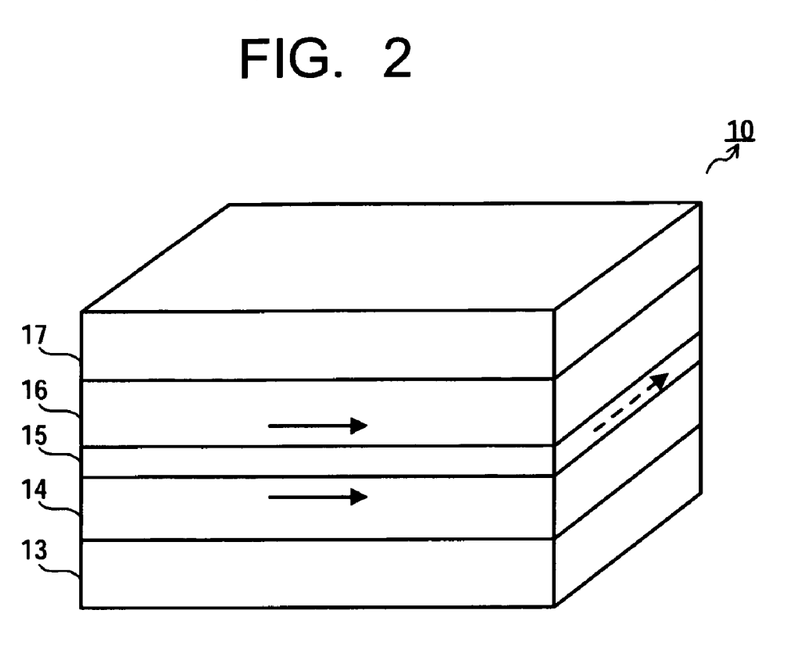
FIG. 2 is an enlarged structural view illustrating the layer structure constituting the spin dependent scattering unit illustrated in FIG. 1.
Figure 3:
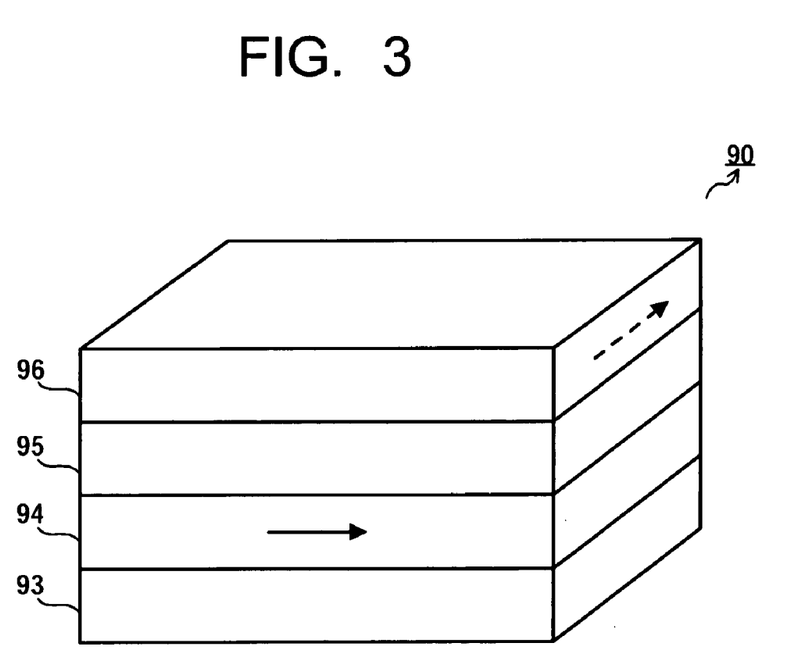
FIG. 3 is an enlarged structural view illustrating the layer structure constituting the spin dependent scattering unit of a conventional magneto-resistance effect element.

FIG. 1 is a perspective view illustrating a magneto-resistance effect element in this embodiment. FIG. 2 is an enlarged view illustrating the layer structure of the spin dependent scattering unit. FIG. 3 is an enlarged view illustrating the layer structure of the spin dependent scattering unit of a conventional magneto-resistance effect element.

As illustrated in FIG. 1, the magneto-resistance effect element includes a magneto-resistance effect film (MR film) 10, a bottom electrode 11 and a top electrode 20 which are formed on a given substrate (not shown). The MR film 10 is disposed between the bottom electrode 11 and the top electrode 20.

As illustrated in FIG. 2, the MR film 10 includes an underlayer 12, a pinning layer 13, a pinned layer 14, a spacer layer 15, a pinned layer 16, a pinning layer 17 and a cap layer 18 which are subsequently formed. The pinned layer 14, the spacer layer 15 and the pinned layer 16 constitute a fundamental structure exhibiting the MR effect, that is, a spin dependent scattering unit. In this embodiment, the pinned layer 14 is a three-layered structure of a pinned layer 141/a magnetic coupling layer 142/a pinned layer 143. Also, the pinned layer 16 is a three-layered structure of a pinned layer 161/a magnetic coupling layer 162/a pinned layer 163. The pinned layer 14 and/or 16 may be made of a single layer. On the other hand, the spin valve film (SV film) 90 includes a pinning layer 93, a pinned layer 94, a spacer layer 95 and a free layer 96 which are subsequently formed.

In the SV film 90, the pinned layer 94, the spacer layer 95 and the free layer 96 constitute the spin dependent scattering unit. The magnetization of the pinned layer 94 is fixed and the magnetization of the free layer 96 is rotated in accordance with an external magnetic field. The spacer layer 95 magnetically divides the pinned layer 95 and the free layer 96 so that the magnetization of the free layer 96 can be independent from the magnetization of the pinned layer 94. The external magnetic field can be detected by the relative angle change in magnetization between the pinned layer 94 and the free layer 96.

On the other hand, with the magneto-resistance effect element 10, the spin dependent scattering unit exhibiting the MR effect is constituted from the pinned layer 14, the spacer layer 15 and the pinned layer 16. Namely, the spacer layer 15 does not function as magnetically dividing the pinned layer 14 and the pinned layer 16 different from the SV film of the conventional magneto-resistance effect element 90 so that the spacer layer 15 is located adjacent to the pinned layer 16.

In the SV film 90, the spacer layer 95 is made of a non-magnetic layer. In this case, the electrons throughout the spacer layer 95 contain spin information because the electrons are flowed from the magnetic layer (the pinned layer 94 or the free layer 96). In order to realize a larger resistance variation in the SV film 90, it is important to maintain the spin information of the electrons. However, since the spacer layer 95 is the non-magnetic layer as described above, it is difficult to form the spacer layer 95 as an idealistic condition. For example, some crystal defects and impurities may be contained in the spacer layer 95 so as to cause the spin flip therein so that the spin information of the electrons may be diminished. As a result, the resistance variation maybe decreased and thus, the MR effect maybe decreased.

In this embodiment, in contrast, the MR film 10 does not contain a conventional spacer layer as the SV film 90 so that the electrons from the pinned layer 14 or 16 is flowed into the spacer layer 15. Since the spacer layer 15 can exhibit magnetic property to some degrees, the possibility of spin flip in the spacer layer 15 is decreased even though the spacer layer 15 contains some crystal defects in comparison with the SV film 90 as shown in FIG. 3. As a result, the spin dependent scattering unit (layer structure) in FIG. 2 can exhibit a larger resistance variation, that is, a larger MR effect in comparison with the SV film 90 in FIG. 3.

The layer number of the spin independent scattering unit of the MR film 10 is set equal to the layer number of the spin independent scattering unit of the SV film 90. However, since the MR film 10 does not contain a conventional spacer layer to magnetically divide the magnetic layers, the MR film 10 constitutes a substantial dual spin valve film by containing the pinned layers 14 and 16 so as to sandwich the spacer layer 15.

A conventional dual SV film is constituted from the five layered structure of a pinned layer/a spacer layer/a free layer/a spacer layer/a pinned layer. Since the MR film 10 is constituted from the three layered structure of the pinned layer 14/the spacer layer 15/the pinned layer 16, the variation ratio in magnetic resistance of the MR film 10 can be easily increased because the total thickness of the MR film 10 becomes thinner.

In order to cause the MR effect in the MR film 10, it is required to appropriately select a material making the spacer layer 15. Concretely, the spacer layer 15 is made of a thinnest oxide layer, nitride layer, oxynitride layer or metallic layer. The oxide layer, the nitride layer and the oxynitride layer contain, as a matrix, Ti, V, Cr, Mn, Fe, Co, Ni, Zr, Pd, Nb, W, Mo and/or Ta. The metallic layer is made of a metallic material containing Ti, V, Cr and/or Mn.

The thickness of the oxide layer, nitride layer or oxynitride layer is set to be thinner, e.g., within a range of 0.5 to 3 nm. In this case, the variation ratio in magnetic resistance of the MR film 10 can be decreased without the increase of the resistance of the MF film 10. The thickness of the metallic layer may be set to be thicker, e.g., 3 nm or more because the resistance of the MR film 10 can be reduced. In this point of view, the thickness of the metallic layer is set within a range of 0.5 to 3 nm as the oxide layer or the like, and more, to about 5 nm.

In an embodiment, the spacer layer 15 can be made of a TiOx—Co, Fe layer wherein the TiOx is a main component and the Co, Fe is a sub component. In this case, the MR film 10 can exhibit a lower resistance condition by applying a magnetic field to the MR film 10 in the forward direction and a higher resistance condition by applying a magnetic field with an intensity of 100 Oe to the MR film 10 in the backward direction.

When a magnetization is generated in the spacer layer 15, the spacer layer 15 functions as a free layer of which the magnetization is rotated in accordance with an external magnetic field. When the magnetization of the spacer layer 15 is parallel to the magnetizations of the pinned layers 14 and 16, the resistance of the MR film 10 becomes low. When the magnetization of the spacer layer 15 is antiparallel to the magnetizations of the pinned layers 14 and 16, the resistance of the MR film 10 becomes high. Under the condition of no external magnetic field, for example, the magnetization of the spacer layer 15 is almost orthogonal to the magnetizations of the pinned layers 14 and 16.

Herein, the magnetization of the TiOx layer can not be examined by a VSM (vibrating sample magnetometer) commercially available at present. If examined, it is considered that the magnetization of the TiOx layer is very small.

The spacer layer 15 may contain an additive element such as Fe, Co, Ni, Ti, Hf, Mg, Zr, V, Mo, Si, Cr, Nb, Ta, W, B, C, V. The content of the additive element may be set within a range of 0 to 50%.

The spacer layer 15 may be made of a metallic material composing Ti, V, Cr, Mn, Pd as a main component and Fe, Co, Ni as a sub component as occasion demands, instead of the oxide layer, the nitride layer or the oxynitride layer. In this case, the magnetization is likely to be generated in the spacer layer 15. In this embodiment, particularly, since the spacer layer 15 is sandwiched by the ferromagnetic layers (pinned layers), the magnetization is much likely to be generated. Therefore, if the above-mentioned metallic material is employed as the spacer layer 15, the spacer layer 15 can be made directly of the metallic material, not the oxide or the like.

(Concrete Structure of Magneto-Resistance Effect Element)

Then, the concrete (entire) structure of the above-described magneto-resistance effect element will be described.

(First Embodiment: First Magneto-Resistance Effect Element)

Figure 4:
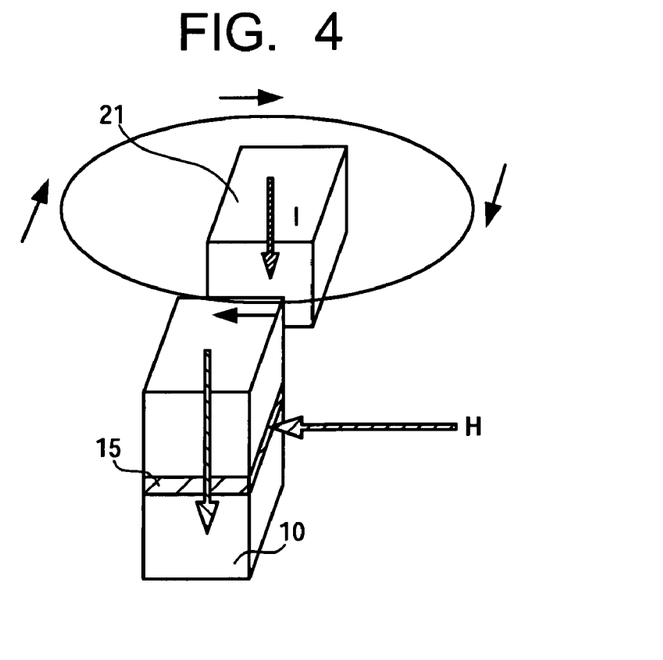
FIG. 4 is a structural view illustrating the total structure of the magneto-resistance effect element by containing a current bias generating portion.
Figure 5:
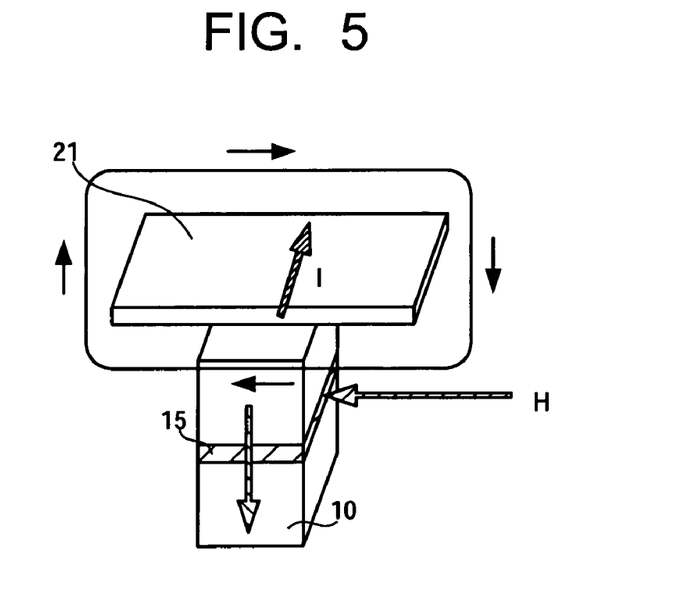
FIG. 5 is a structural view illustrating the total structure of the magneto-resistance effect element by containing another current bias generating portion.
Figure 6:
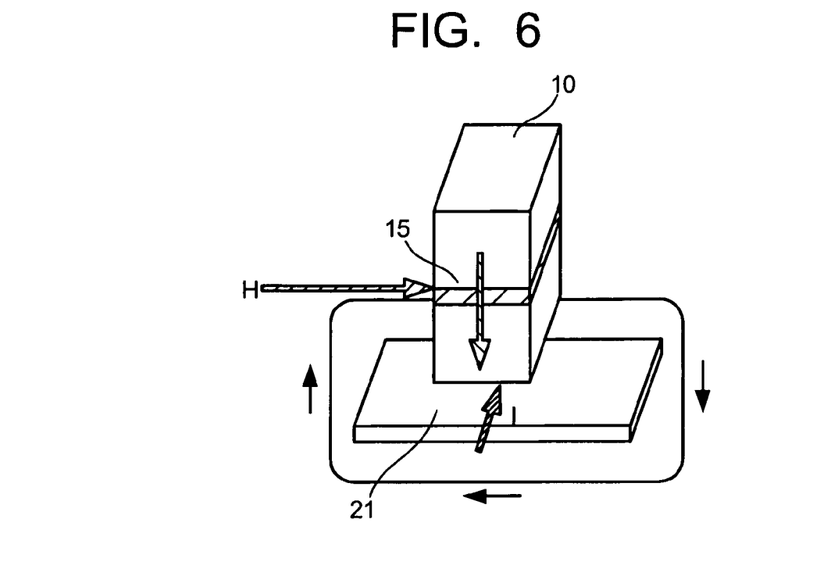
FIG. 6 is a structural view illustrating the total structure of the magneto-resistance effect element by containing still another current bias generating portion.

FIGS. 4 to 6 relate to the concrete structure of the magneto-resistance effect element wherein a current bias generating portion 21 is provided for the above-described magneto-resistance effect element as a fundamental structure. In these drawings, for simplification, the bottom electrode 11 and the top electrode 20 are omitted so that only the MR film 10 is represented as the magneto-resistance effect element. Since the current bias generating portion 21 applies a magnetic field to the spacer layer 15, the spacer layer 15 is concretely depicted in the MR film 10.

As shown in FIGS. 4 to 6, the current bias generating portion 21 is formed as a platy structure. In FIG. 4, the current bias generating portion 21 (platy structure) is disposed adjacent to the side surface of the magneto-resistance effect element so that the current is flowed therein along the thickness direction (from the top side to the bottom side). In this case, the clockwise bias magnetic field "H" is generated in an area perpendicular to the page space (in the direction parallel to the main surface of the spacer layer 15) around the current direction and then, applied to the spacer layer 15 of the MR film 10. When the current is flowed from the bottom side to the top side in the current bias generating portion 21, the anticlockwise bias magnetic field "H" is generated in an area perpendicular to the page space(in the direction parallel to the main surface of the spacer layer 15).

In FIG. 5, the current bias generating portion 21 (platy structure) is disposed above the magneto-resistance effect element so that the current is flowed therein along the width direction (from the front side to the back side). In this case, the clockwise bias magnetic field "H" is generated in an area parallel to the page space (in the direction parallel to the main surface of the spacer layer 15) around the current direction and then, applied to the spacer layer 15 of the MR film 10. When the current is flowed from the back side to the front side in the current bias generating portion 21, the anticlockwise bias magnetic field "H" is generated in an area perpendicular to the page space(in the direction parallel to the main surface of the spacer layer 15).

In FIG. 6, the current bias generating portion 21 (platy structure) is disposed below the magneto-resistance effect element so that the current is flowed therein along the width direction (from the front side to the backside). In this case, the clockwise bias magnetic field "H" is generated in an area parallel to the page space (in the direction parallel to the main surface of the spacer layer 15) around the current direction and then, applied to the spacer layer 15 of the MR film 10. When the current is flowed from the back side to the front side in the current bias generating portion 21, the anticlockwise bias magnetic field "H" is generated in an area perpendicular to the page space (in the direction parallel to the main surface of the spacer layer 15).

Since the spacer layer 15 is made of the oxide layer the nitride layer or the like within a thickness range of 0.5 to 3 nm, the saturated magnetization of the spacer layer 15 is small. Therefore, only if a smaller magnetic field is applied to the spacer layer 15 from the current bias generating portion 21 as shown in FIGS. 4 to 6, the magnetic domain of the spacer layer 15 can be controlled, preferably as a single magnetic domain. If such a smaller magnetic field is applied to the free layer of the SV film as shown in FIG. 3, the magnetic domain of the free layer can not be controlled. As a result, the magnetic noise such as Barkhausen noise in the MR film 10 can be suppressed effectively in comparison with the magnetic noise in the SV film 90.

The intensity of the bias magnetic field can be set within a range of 5 to 50 Oe. In this case, the magnetic domain of the spacer layer 15 of the MR film 10.

It is required that the current bias generating portion 21 is made of a conductive material so as to generate the bias magnetic field around the current by flowing the current therein. In this point of view, the current bias generating portion 21 may be made of at least one selected from the group consisting of Ti, V, Cr, Mn, Cu, Zr, Nb, Mo, Ru, Rh, Pd, Ag, Hf, Ta, W, Re, Pt and Au.

Figure 7:
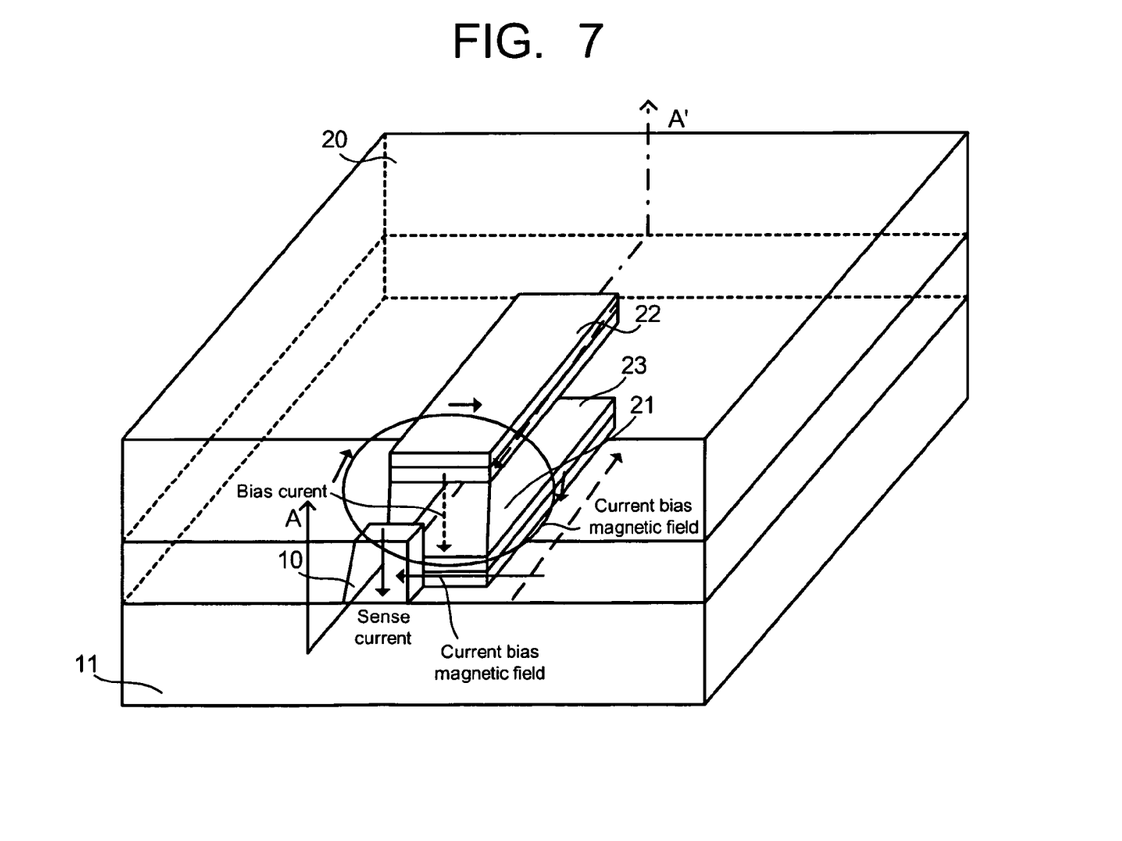
FIG. 7 is a perspective view illustrating the concrete structure of a magneto-resistance effect element containing a current bias generating portion therein.
Figure 8:
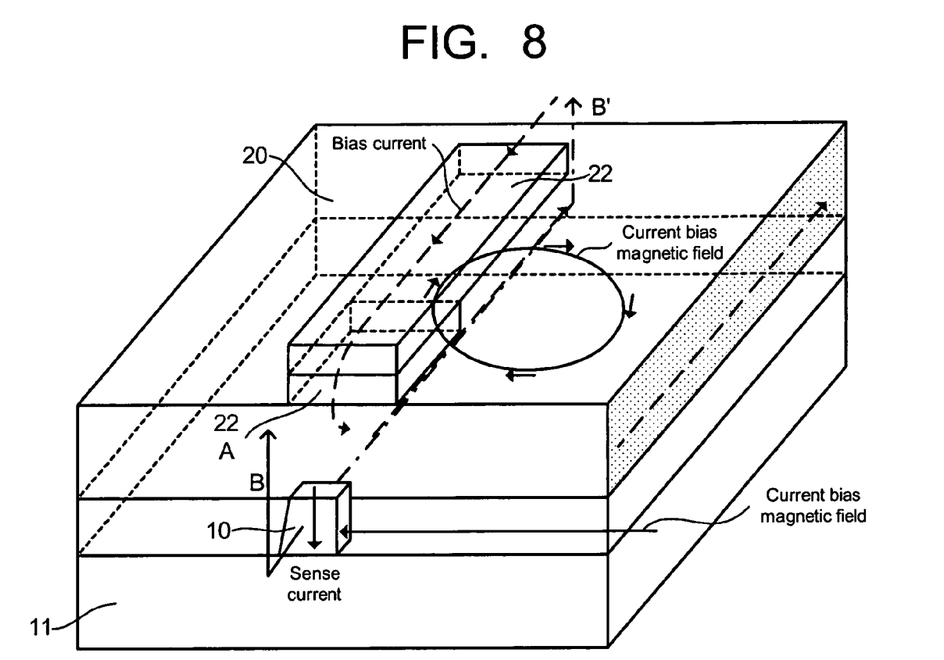
FIG. 8 is a perspective view illustrating the concrete structure of a magneto-resistance effect element containing another current bias generating portion therein.
Figure 9:
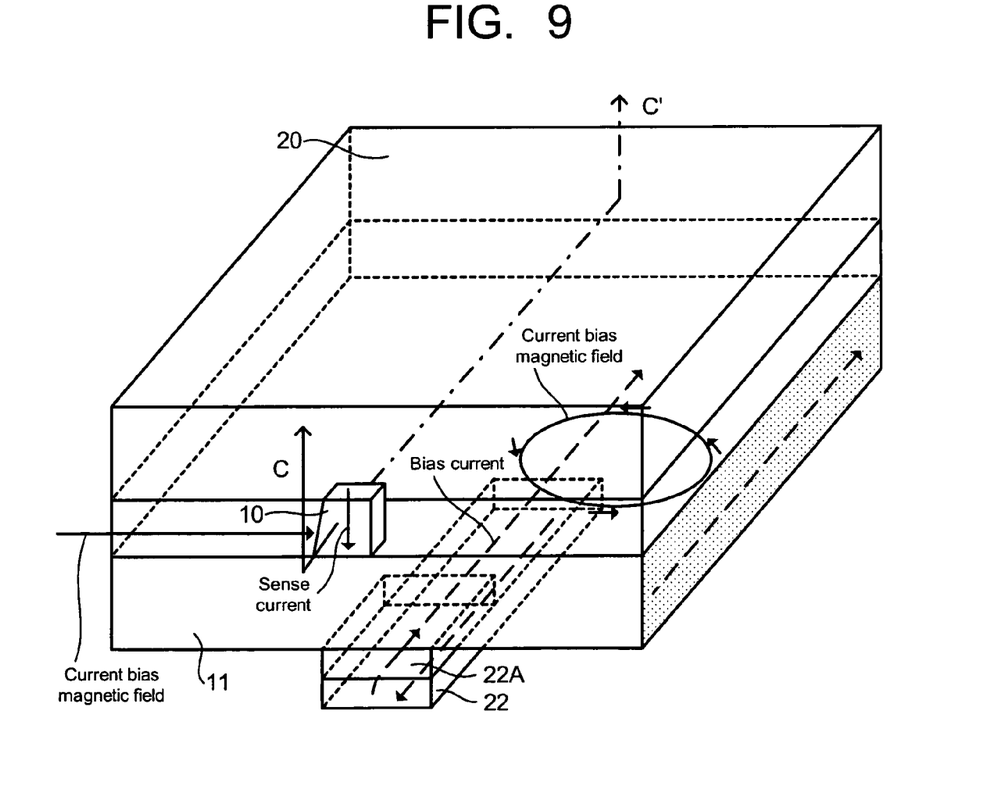
FIG. 9 is a perspective view illustrating the concrete structure of a magneto-resistance effect element containing still another current bias generating portion therein.
Figure 10:
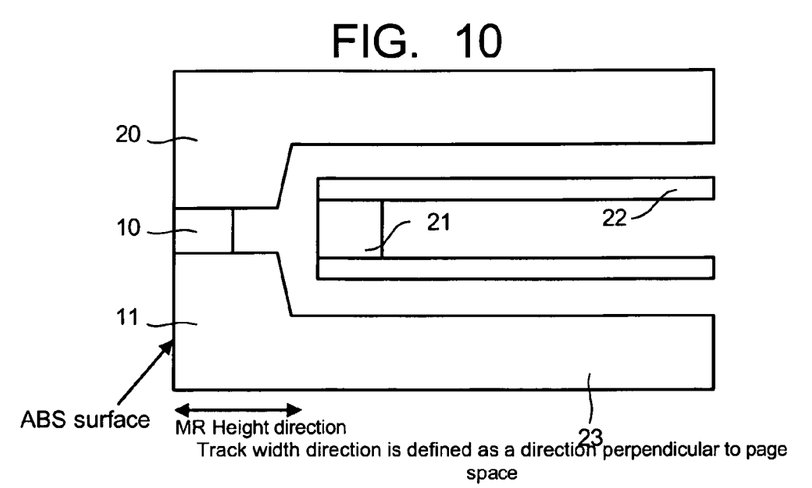
FIG. 10 is a cross sectional view of the magneto-resistance effect element illustrated in FIG. 7, taken on line "A-A'".
Figure 11:
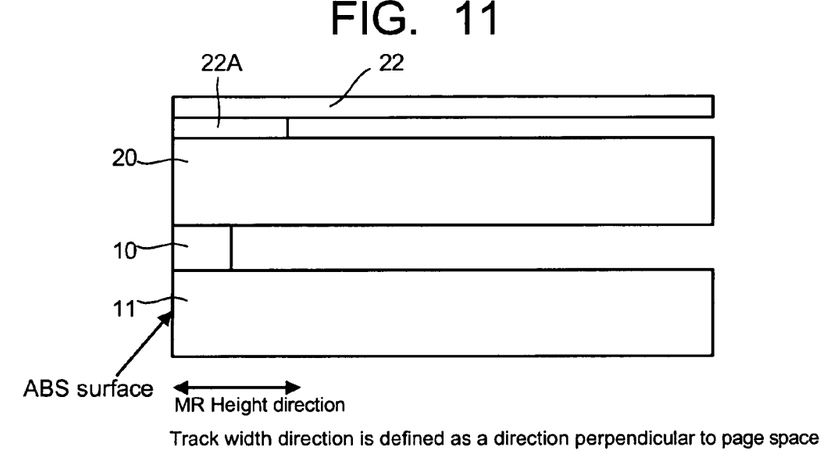
FIG. 11 is a cross sectional view of the magneto-resistance effect element illustrated in FIG. 8, taken on line "B-B'".
Figure 12:
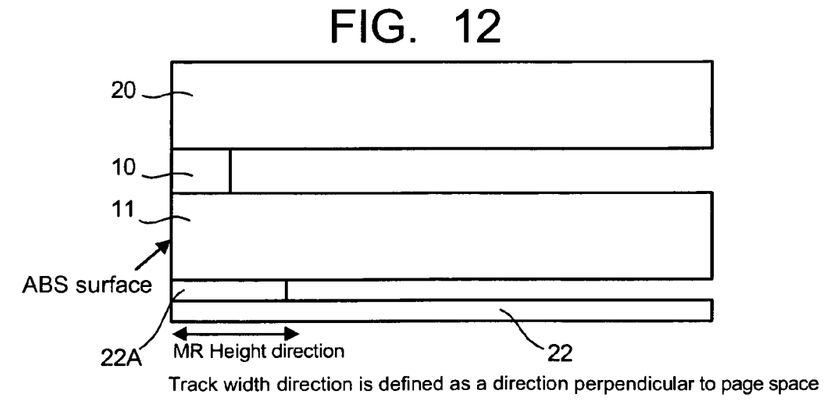
FIG. 12 is a cross sectional view of the magneto-resistance effect element illustrated in FIG. 9, taken on line "C-C'".

FIGS. 7 to 9 relate to the magneto-resistance effect element with the current bias generating portion 21 built therein. FIGS. 10 to 12 show to the cross sections of the magneto-resistance effect elements shown in FIGS. 7 to 9, taken on lines "A-A'", "B-B'" and "C-C'", respectively. FIGS. 7 and 10 show the magneto-resistance effect element with the current bias generating portion 21 shown in FIG. 4. FIGS. 8 and 11 show the magneto-resistance effect element with the current bias generating portion 21 shown in FIG. 5. FIGS. 9 and 12 show the magneto-resistance effect element with the current bias generating portion 21 shown in FIG. 6.

In FIGS. 7 and 10, the current bias generating portion 21 is disposed backward (in the side opposite to the ABS in the direction of MR height) from the MR film 10 between the bottom electrode 11 and the top electrode 20. A pair of electrode layers 22 and 23 are disposed in contact with the bottom surface and the top surface of the current bias generating portion 21 respectively between the bottom electrode 11 and the top electrode 20. Therefore, the bias current is supplied into the current bias generating portion 21 via the electrode layers 22 and 23 as designated by the broken line so as to generate the clockwise bias magnetic field "H" around the bias current as designated by the solid line. In this case, the bias magnetic field "H" is applied laterally (from the right side to the left side) to the spacer layer (i.e., the external magnetic field-detecting layer) of the MR film 10 as shown in FIG. 4.

As a result, the magnetic domain of the spacer layer (external magnetic field-detecting layer) can be a single domain so as to prevent the magnetic noise such as Barkhausen noise. For example, the sense current can be flowed in the MR film 10 as designated by the solid line in FIG. 7.

In FIGS. 8 and 11, the top electrode 20 functions as the current bias generating portion 21. The top electrode 20 and the electrode layer 22 is electrically connected with one another via a conductive layer 22A provided at the front end of the magneto-resistance effect element in the side of ABS. The top electrode 20 and the electrode layer 22 are electrically insulated from one another except the electric connection via the conductive layer 22A. In this case, the bias current is flowed toward the side of ABS in the electrode layer 22, downward in the conductive layer 22A and backward from the side of ABS in the top electrode 20. As a result, the clockwise bias magnetic field "H" caused by the bias current is generated around the conductive layer 22A as designated by the arrow in FIG. 8. In this case, the bias magnetic field "H" is applied laterally (from the right side to the left side) to the spacer layer (i.e., the external magnetic field-detecting layer) of the MR film 10 as shown in FIG. 5.

As a result, the magnetic domain of the spacer layer (external magnetic field-detecting layer) can be a single domain so as to prevent the magnetic noise such as Barkhausen noise. For example, the sense current can be flowed in the MR film 10 as designated by the solid line in FIG. 8.

In FIGS. 9 and 12, the bottom electrode 11 functions as the current bias generating portion 21. The bottom electrode 11 and the electrode layer 22 is electrically connected with one another via the conductive layer 22A provided at the front end of the magneto-resistance effect element in the side of ABS. The bottom electrode 11 and the electrode layer 22 are electrically insulated from one another except the electric connection via the conductive layer 22A. In this case, the bias current is flowed toward the side of ABS in the electrode layer 22, upward in the conductive layer 22A and backward from the side of ABS in the bottom electrode 20. As a result, the anticlockwise bias magnetic field "H" caused by the bias current is generated around the conductive layer 22A as designated by the arrow in FIG. 9. In this case, the bias magnetic field "H" is applied laterally (from the left side to the right side) to the spacer layer (i.e., the external magnetic field-detecting layer) of the MR film 10 as shown in FIG. 6.

As a result, the magnetic domain of the spacer layer (external magnetic field-detecting layer) can be a single domain so as to prevent the magnetic noise such as Barkhausen noise. For example, the sense current can be flowed in the MR film 10 as designated by the solid line in FIG. 9.

Figure 13:
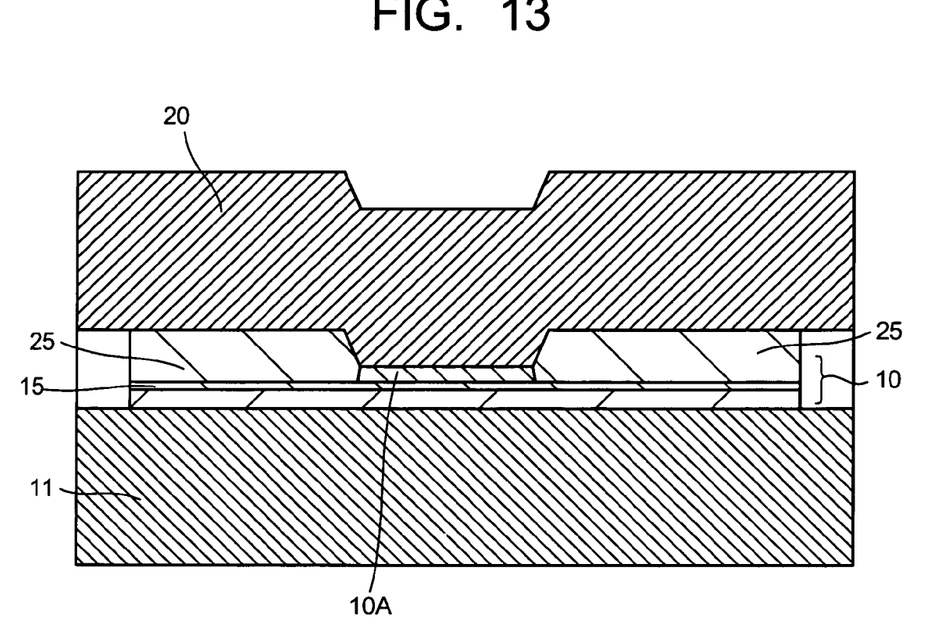
FIG. 13 is a fundamental structural view illustrating a magneto-resistance effect element by containing an exchange coupling layer according to an embodiment.

FIG. 13 is a cross sectional view illustrating the magneto-resistance effect element wherein an exchange coupling layer 25 is provided for the above-described magneto-resistance effect element as a fundamental structure. In the drawing, the concrete structure of the MR film 10 is simplified. However, since the exchange coupling layer 25 applies a bias magnetic field to the spacer layer 15 of the MR film 10 through exchange coupling, the spacer layer 15 is clearly denoted.

As shown in FIG. 13, the exchange coupling layer 25 is formed on both ends of the spacer layer 15 except the magnetic sensitive reproducing portion 10A so as to be exchange-coupled with the spacer layer 15. The magnetic domain of the spacer layer 15 can be easily controlled by the exchange coupling layer 25 and then, preferably a single magnetic domain. As a result, the magnetic noise such as Barkhausen noise can be prevented effectively different from the conventional SV film.

If the exchange coupling layer 25 is formed so as to cover the magnetic sensitive reproducing portion 10A, the magnetization of the spacer layer 15 may be fixed by the magnetic exchange coupling with the exchange coupling layer 25 so that the magnetization of the spacer layer can not be easily rotated in accordance with an external magnetic field. As a result, in this case, the MR effect of the magneto-resistance effect element may be decreased.

The exchange coupling layer 25 may be made of an antiferromagnetic material such as IrMn, PtMn, PdPtMn, NiMn, RuMn, RhMn and RuRhMn. Also, the exchange coupling layer 25 may be made of another antiferromagnetic material such as $\alpha$-Fe$_2$O$_3$, NiO, $\alpha$-Fe$_2$O$_3$—NiO, CoO—NiO. In this case, the magnetic domain of the spacer layer can be controlled more effectively and efficiently through exchange coupling.

Not limited, the thickness of the exchange coupling layer 25 may be set within a range of 5 to 20 nm.

EXAMPLES

The present invention will be described in detail in

Example 1

Example 1 relating to the magneto-resistance effect element as shown in FIG. 4 (7) will be described. In Example 1, the magneto-resistance effect element was formed as follows:
Bottom electrode 11: NiFe 1.5 μm
Underlayer 12 (buffer layer 12a/seed layer 12b): Ta 5 nm/Ru 2 μm
Pinning layer 13: PtMn 15 nm
Pinned layer 14 (pinned layer 141/magnetic coupling layer 142/pinned layer 143): CoFe 3 nm/Ru 0.9 nm/CoFe 3 nm
Spacer layer 15: TiOx 2 nm
Pinned layer 16 (pinned layer 161/magnetic coupling layer 162/pinned layer 163): CoFe 3 nm/Ru 0.9 nm/CoFe 3 nm
Pinning layer 17: PtMn 15 nm
Cap layer 18: Ta 5 nm
Current bias generating portion 21: Ti 50 nm
The above-described layers were subsequently formed except the top electrode to form the laminated body, and then, thermally treated at 290° C. for four hours under a magnetic field of 10 kOe so as to enhance the crystallinity of the laminated body and the regularization of the pinning layers 13 and 16. Then, the element size of the SV film was defined by means of photolithography and the top electrode 20 was formed on the laminated body.

Then, a current of 1 to 10 mA was flowed in the current bias generating portion 21 to generate the bias magnetic field to be applied to the spacer layer 15 so as to conduct the magnetic domain control of the spacer layer 15.

In this Example, when an external magnetic field was applied to the magneto-resistance effect element in the forward direction (so that the direction of the external magnetic field becomes parallel to the direction of the magnetizations of the pinned layers 161 and 143), the resistance of the magneto-resistance effect element became low. When an external magnetic field of about 100 Oe was applied to the magneto-resistance effect element in the backward direction (so that the direction of the external magnetic field becomes antiparallel to the direction of the magnetizations of the pinned layers 161 and 143), the resistance of the magneto-resistance effect element becomes high. Moreover, the variation ratio in magnetic resistance of the magneto-resistance effect (MR) was 16%. No Barkhausen noise was observed.

Example 2 relating to the magneto-resistance effect element as shown in FIG. 13 will be described. In Example 2, the magneto-resistance effect element was formed as follows:
Bottom electrode 11: NiFe 1.5 μm
Underlayer 12 (buffer layer 12a/seed layer 12b): Ta 5 nm/Ru 2 nm
Pinning layer 13: PtMn 15 nm
Pinned layer 14 (pinned layer 141/magnetic coupling layer 142/pinned layer 143): CoFe 3 nm/Ru 0.9 nm/CoFe 3 nm
Pinning layer 17: PtMn 15 nm
Cap layer 18: Ta 5 nm
Top electrode 20: NiFe 1.2 μm
Current bias generating portion 21: Ti 50 nm
The above-described layers were subsequently formed except the top electrode to form the laminated body, and then, thermally treated at 290° C. for four hours under a magnetic field of 10 kOe so as to enhance the crystallinity of the laminated body and the regularization of the pinning layers 13 and 16. Then, the element size of the SV film was defined and the top electrode 20 was formed on the laminated body.

In this Example, when an external magnetic field was applied to the magneto-resistance effect element in the forward direction (so that the direction of the external magnetic field becomes parallel to the direction of the magnetizations of the pinned layers 161 and 143), the resistance of the magneto-resistance effect element became low. When an external magnetic field of about 100 Oe was applied to the magneto-resistance effect element in the backward direction (so that the direction of the external magnetic field becomes antiparallel to the direction of the magnetizations of the pinned layers 161 and 143), the resistance of the magneto-resistance effect element becomes high. Moreover, the variation ratio in magnetic resistance of the magneto-resistance effect (MR) was 16%. No Barkhausen noise was observed.

Comparative Example

In this Comparative Example, the magneto-resistance effect element was formed in the same manner as Example 1 except that the bias current generating portion 21 was not formed. The variation ratio in magnetic resistance of the magneto-resistance effect (MR) was 16%. Moreover, Barkhausen noise was generated with possibility of 70 to 80%.

(Magnetic Head and Magnetic Recording/Reproducing Device)

The magneto-resistance effect element is installed in advance in an all-in-one magnetic head assembly allowing both the recording/reproducing, and mounted as the head assembly at the magnetic recording/reproducing device.

Figure 14:
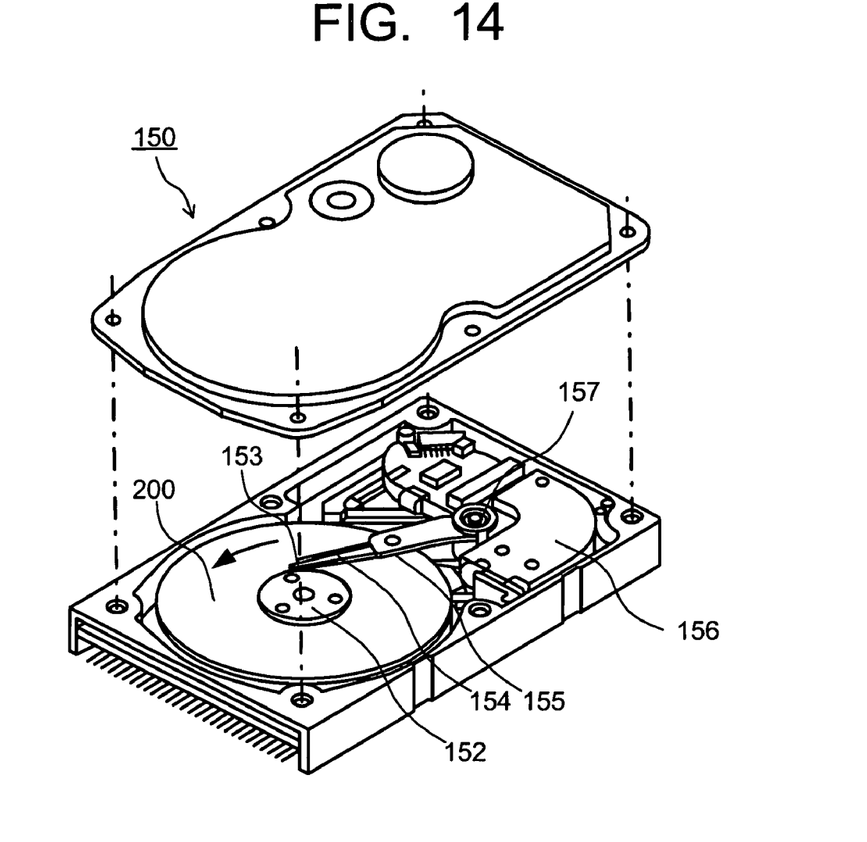
FIG. 14 is a perspective view illustrating a magnetic recording/reproducing device according to the present invention.

FIG. 14 is a perspective view illustrating the schematic structure of the magnetic recording/reproducing device. The magnetic recording/reproducing device 150 illustrated in FIG. 14 constitutes a rotary actuator type magnetic recording/reproducing device. In FIG. 14, a magnetic recording disk 200 is mounted to a spindle 152 to be turned in the direction designated by the arrow A by a motor (not shown) which is driven in response to control signals from a drive unit controller (not shown). In FIG. 14, the magnetic recording/reproducing apparatus 150 may be that provided with a single magnetic recording disk 200, but with a plurality of magnetic recording disks 200.

A head slider 153 recording/reproducing information to be stored in the magnetic recording disk 200 is mounted on a tip of a suspension 154 of a thin film type. The head slider 153 mounts at the tip the magnetic head containing the magnetic resistance effect element as described in above embodiments.

When the magnetic recording disk 200 is rotated, such a surface (ABS) of the head slider 153 as being opposite to the magnetic recording disk 200 is floated from on the main surface of the magnetic recording disk 200. Alternatively, the slider may constitute a so-called "contact running type" slider such that the slider is in contact with the magnetic recording disk 200.

The suspension 154 is connected to one edge of the actuator arm 155 with a bobbin portion supporting a driving coil (not shown) and the like. A voice coil motor 156 being a kind of a linear motor is provided at the other edge of the actuator arm 155. The voice coil motor 156 is composed of the driving coil (not shown) wound around the bobbin portion of the actuator arm 155 and a magnetic circuit with a permanent magnet and a counter yoke which are disposed opposite to one another so as to sandwich the driving coil.

The actuator arm 155 is supported by ball bearings (not shown) provided at the upper portion and the lower portion of the spindle 157 so as to be rotated and slid freely by the voice coil motor 156.

Figure 15:
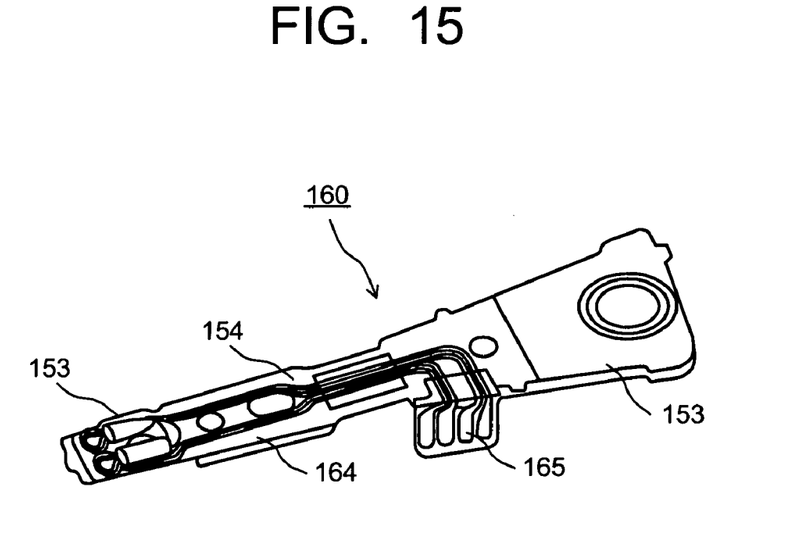
FIG. 15 is an enlarged perspective view illustrating the magnetic head assembly of the magnetic recording/reproducing device in FIG. 14

FIG. 15 is an enlarged perspective view illustrating a portion of the magnetic head assembly positioned at the tip side thereof from the actuator arm 155, as viewed from the side of the magnetic recording disk 200. As illustrated in FIG. 15, the magnetic head assembly 160 has the actuator arm 155 with the bobbin portion supporting the driving coil and the like. The suspension 154 is connected with the one edge of the actuator arm 155.

Then, the head slider 153 with the magnetic head containing the magneto-resistance effect element as defined in above-embodiments is attached to the tip of the suspension 154. The suspension 154 includes a lead wire 164 for writing/reading signals, where the lead wire 164 is electrically connected with the respective electrodes of the magnetic head embedded in the head slider 153. In the drawing, reference numeral "165" denotes an electrode pad of the assembly 160.

In the magnetic recording/reproducing device illustrated in FIGS. 14 and 15, since the magneto-resistance effect element as described in the above embodiments is installed, the information magnetically recorded in the magnetic recording disk 200 under higher density recording than normal recording can be read out properly.

(Magnetic Memory)

The magneto-resistance effect element as described above can constitute a magnetic memory such as a magnetic random access memory (MRAM) where memory cells are arranged in matrix.

Figure 16:
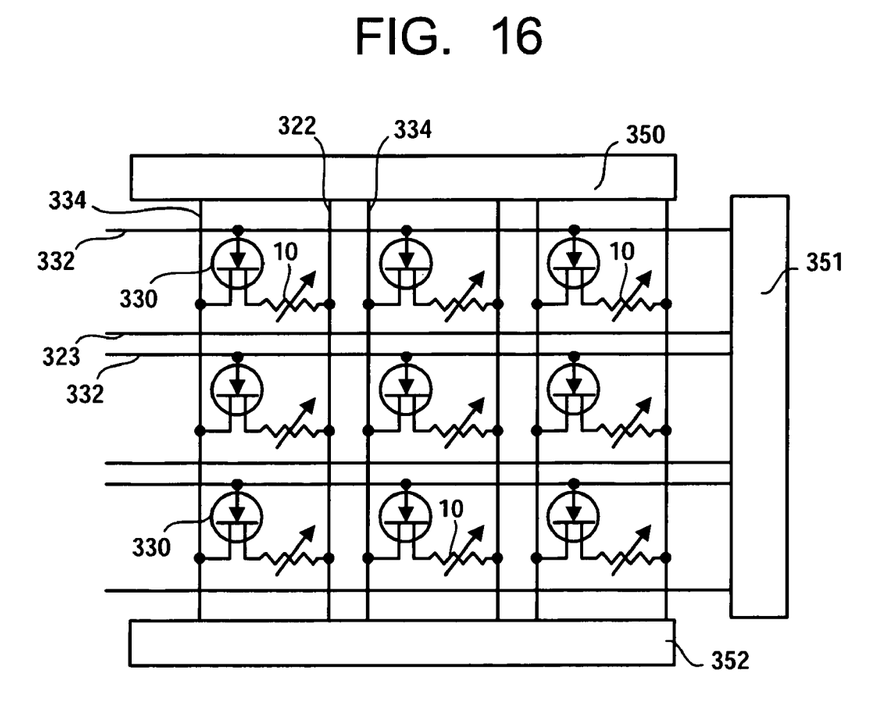
FIG. 16 is a view illustrating a magnetic memory matrix according to an embodiment.

FIG. 16 is a view illustrating an embodiment of the magnetic memory matrix according to the present invention. This drawing shows a circuit configuration when the memory cells are arranged in an array. In order to select one bit in the array, a column decoder 350 and a line decoder 351 are provided, where a switching transistor 330 is turned ON by a bit line 334 and a word line 332 and to be selected uniquely, so that the bit information recorded in a magnetic recording layer (free layer) in the magneto-resistance effect film 10 can be read out by being detected by a sense amplifier 352. In order to write the bit information, a writing current is flowed in a specific write word line 323 and a bit line 322 to generate a magnetic field for writing.

Figure 17:
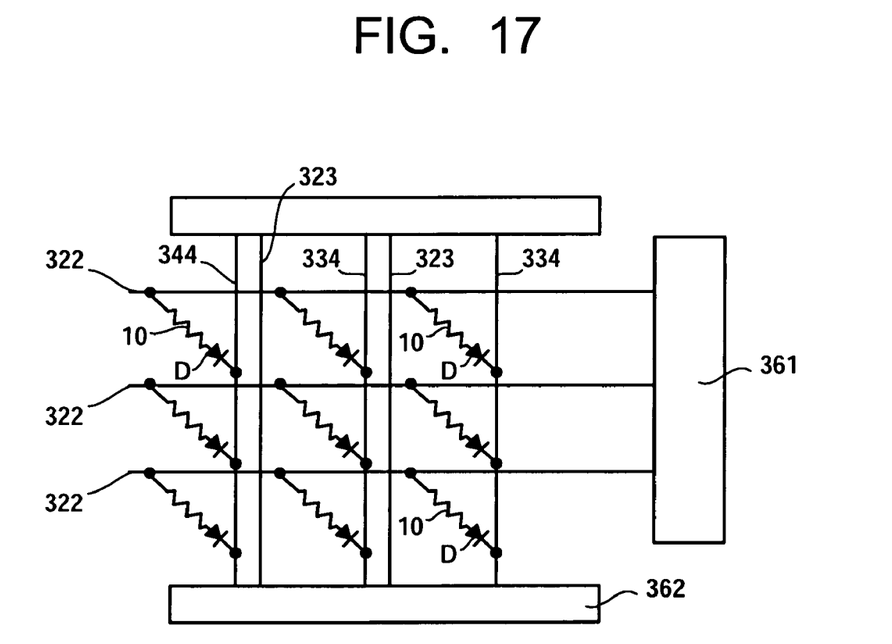
FIG. 17 is a view illustrating another magnetic memory matrix according to another embodiment.

FIG. 17 is a view illustrating another embodiment of the magnetic memory matrix according to the present invention. In this case, a bit line 322 and a word line 334 which are arranged in matrix are selected by decoders 360, 361, respectively, so that a specific memory cell in the array is selected. Each memory cell is configured such that the magneto-resistance effect film 10 and a diode D is connected in series. Here, the diode D plays a role of preventing a sense current from detouring in the memory cell other than the selected magneto-resistance effect film 10. A writing is performed by a magnetic field generated by flowing the writing current in the specific bit line 322 and the word line 323, respectively.

Figure 18:
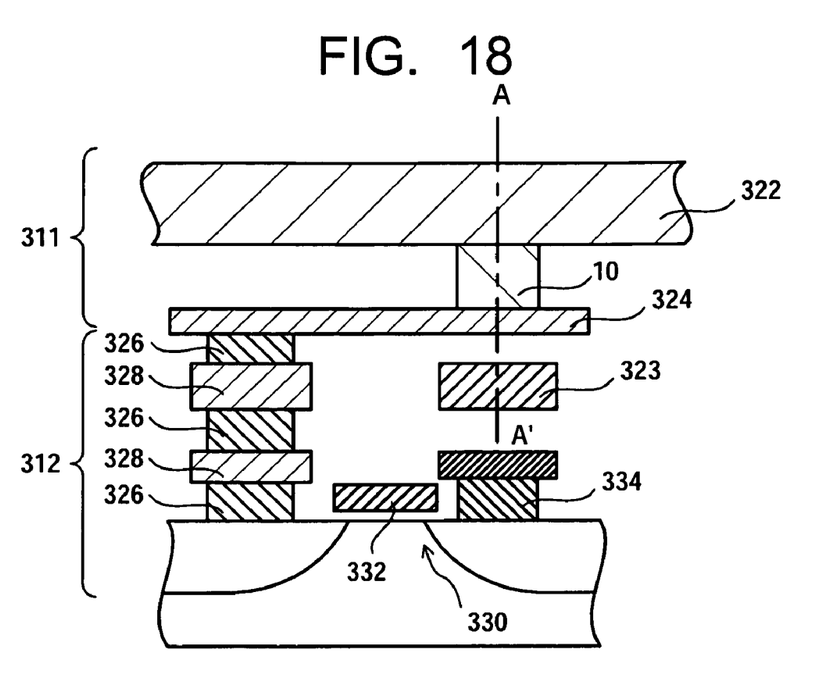
FIG. 18 is a cross sectional view illustrating an essential part of the magnetic memory.
Figure 19:
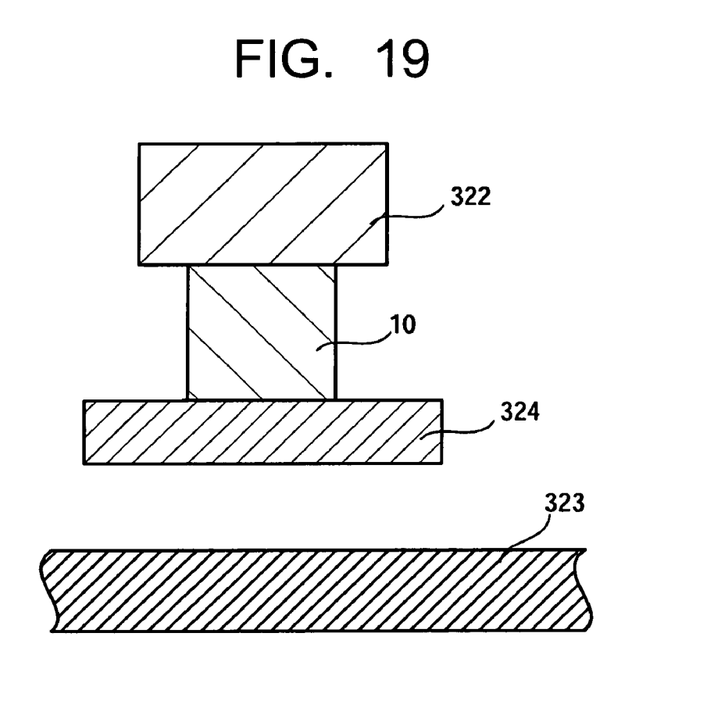
FIG. 19 is a cross sectional view of the magnetic memory illustrated in FIG. 18, taken on line "A-A'".

FIG. 18 is a cross sectional view illustrating a substantial portion of the magnetic memory in an embodiment according to the present invention. FIG. 19 is a cross sectional view of the magnetic memory illustrated in FIG. 18, taken on line "A-A'". The configuration shown in these drawings corresponds to a 1-bit memory cell included in the magnetic memory shown in FIG. 16 or FIG. 17. This memory cell includes a memory element part 311 and an address selection transistor part 312.

The memory element part 311 includes the magneto-resistance effect film 10 and a pair of wirings 322, 324 connected to the magneto-resistance effect film 10. The magneto-resistance effect film 10 is the magneto-resistance effect element (CCP-CPP element) as described in the above embodiments.

Meanwhile, in the address selection transistor part 312, a transistor 330 having connection therewith via a via 326 and an embedded wiring 328 is provided. The transistor 330 performs switching operations in accordance with voltages applied to a gate 332 to control the opening/closing of the current confined path between the magneto-resistance effect film 10 and the wiring 334.

Further, below the magneto-resistance effect film 10, a write wiring 323 is provided in the direction substantially orthogonal to the wiring 322. These write wirings 322, 323 can be formed of, for example, aluminum (Al), copper (Cu), tungsten (W), tantalum (Ta) or an alloy containing any of these elements.

In the memory cell of such a configuration, when writing bit information into the magneto-resistance effect element 10, a writing pulse current is flowed in the wirings 322, 323, and a synthetic magnetic field induced by the writing current is applied to appropriately invert the magnetization of a recording layer of the magneto-resistance effect element 10.

Further, when reading out the bit information, a sense current is flowed through the magneto-resistance effect element 10 including the magnetic recording layer and a lower electrode 324 to measure a resistance value of or a fluctuation in the resistance values of the magneto-resistance effect element 10.

The magnetic memory according to the embodiment can assure writing and reading by surely controlling the magnetic domain of the recording layer even though the cell is miniaturized in size, with the use of the magneto-resistance effect element (CCP-CPP element) according to the above-described embodiment.

Although the present invention was described in detail with reference to the above examples, this invention is not limited to the above disclosure and every kind of variation and modification may be made without departing from the scope of the present invention.

In the application of the magneto-resistance effect element to a reproducing magnetic head, if a top and bottom shields are added to the magneto-resistance effect element, the detecting resolution of the magnetic head can be defined.

Moreover, the magneto-resistance effect element can be applied for both of a longitudinal magnetic recording/reproducing device and a vertical magnetic recording/reproducing device.

The magnetic recording/reproducing device may be a so-called stationary type magnetic device where a specific recording medium is installed therein or a so-called removable type magnetic device where a recording medium can be replaced.

What is claimed is:

1. A magneto-resistance effect element, comprising:
   a first magnetic layer of which a first magnetization is fixed in one direction;
   a spacer comprising a single layer and made of at least one selected from the group consisting of an oxide, a nitride, an oxynitride and a metal;
   a second magnetic layer of which a second magnetization is fixed in one direction; and
   a current bias generating portion, which is located adjacent to said spacer layer, for applying a bias magnetic field to said spacer layer,
   wherein the first and second magnetic layers are formed on opposite sides of the spacer.

2. The magneto-resistance effect element as set forth in claim 1,
   wherein said current bias generating portion is formed as a platy structure so as to be located in the vicinity of side surfaces of said first magnetic layer, said second magnetic layer and said spacer layer.

3. The magneto-resistance effect element as set forth in claim 1,
   wherein said current bias generating portion is formed as a platy structure so as to be located above said first magnetic layer, said second magnetic layer and said spacer layer.

4. The magneto-resistance effect element as set forth in claim 1,
   wherein said current bias generating portion is formed as a platy structure so as to be located below said first magnetic layer, said second magnetic layer and said spacer layer.

5. The magneto-resistance effect element as set forth in claim 1, further comprising a current applier for flowing a current to said current bias generating portion.

6. The magneto-resistance effect element as set forth in claim 1,
   wherein said first magnetization and said second magnetization are orthogonal to a magnetization of said spacer layer.

7. The magneto-resistance effect element as set forth in claim 1,
   wherein a thickness of said spacer layer is set within a range of 0.5 to 3 nm.

8. The magneto-resistance effect element as set forth in claim 5,
   wherein said current applier includes a pair of electrode layers so that a top surface and a bottom surface of said current bias generating portion are attached to said electrode layers, respectively.

9. The magneto-resistance effect element as set forth in claim 5,
   wherein said current bias generating portion functions as an electrode for flowing a sense current through said magneto-resistance effect element,
   wherein said current applier includes an electrode layer so that at least one of said electrode layers is electrically connected with said electrode.

10. A magneto-resistance effect element, comprising:
    a first magnetic layer of which a first magnetization is fixed in one direction;
    a spacer layer which is located on said first magnetic layer and which is made of at least one selected from the group consisting of an oxide, a nitride, an oxynitride and a metal;
    a magnetic sensitive reproducing portion which is located on said spacer layer and of which a second magnetization is fixed in one direction; and
    an exchange coupling layer contacted with both ends of said spacer layer except said magnetic sensitive reproducing portion and which conducts an exchange coupling for said spacer layer.

11. The magneto-resistance effect element as set forth in claim 10,
    wherein said exchange coupling layer conducts a magnetic domain control of said spacer layer through said exchange coupling.

12. The magneto-resistance effect element as set forth in claim 10,
    wherein said exchange coupling layer is made of at least one selected from the group consisting of IrMn, PtMn, PdPtMn, NiMn, RuMn, RhMn and RuRhMn.

13. The magneto-resistance effect element as set forth in claim 10,
    wherein said exchange coupling layer is made of at least one selected from the group consisting of $\alpha$-$Fe_2O_3$, NiO, $\alpha$-$Fe_2O_3$—NiO, CoO—NiO.

14. The magneto-resistance effect element as set forth in claim 10,
    wherein a thickness of said exchange coupling layer is set within a range of 5 to 20 nm.

15. A magnetic head comprising a magneto-resistance effect element as set forth in claim 1.

16. A magnetic head comprising a magneto-resistance effect element as set forth in claim 10.

17. A magnetic recording device comprising a magnetic head as set forth in claim 15.

18. A magnetic recording device comprising a magnetic head as set forth in claim 16.

19. A magnetic memory comprising a magneto-resistance effect element as set forth in claim 1.

20. A magnetic memory comprising a magneto-resistance effect element as set forth in claim 10.

* * * * *